(12) United States Patent
Coult et al.

(10) Patent No.: US 6,184,582 B1
(45) Date of Patent: Feb. 6, 2001

(54) ARTICLE COMPRISING A STANDOFF COMPLAINT METALLIZATION AND A METHOD FOR MAKING SAME

(75) Inventors: David Gerald Coult, Bechtelsville, PA (US); Gustav Edward Derkits, Jr., New Providence, NJ (US); Bryan Phillip Segner, Upper Macungie, PA (US)

(73) Assignee: Lucent Technologies, Inc., Murray Hill, NJ (US)

( * ) Notice: Under 35 U.S.C. 154(b), the term of this patent shall be extended for 0 days.

(21) Appl. No.: 09/069,396

(22) Filed: Apr. 29, 1998

(51) Int. Cl.[7] ..................................... H01L 23/48
(52) U.S. Cl. ........................... 257/737; 257/778
(58) Field of Search ................... 257/737, 738, 257/778, 777

(56) References Cited

U.S. PATENT DOCUMENTS 5,956,235 * 9/1999 Krege et al. .................. 257/737

* cited by examiner

Primary Examiner—Roy Potter
(74) Attorney, Agent, or Firm—DeMont & Breyer, LLC; Wayne S. Breyer; Jason P. DeMont

(57) ABSTRACT

Compliant standoffs are disposed on a support surface of a semiconductor or hybrid semiconductor device. The standoffs extend further from the support surface than other active or passive structures associated with the (hybrid) semiconductor device, and are spaced at least a minimum distance from such associated structures. Each compliant standoff provides a surface at which auxiliary devices, such as optical subassemblies, lightwave circuits and the like, can be attached. Since the compliant standoffs extend further from the support surface than other associated structures, such other associated structures are protected from potentially damaging contact with the auxiliary device(s) being attached to the compliant standoffs. Moreover, since the compliant standoffs are spaced from such other asociated structures, potentially damaging thermal and mechanical stresses (imparted to the standoffs as a result of the contact with an auxiliary device such as during bonding) are substantially dissipated by the compliant standoff and directed into the support rather than the other associated structures. The compliant standoffs advantageously comprise conductive materials such that they may be placed in ohmic electrical contact with at least one active region of the (hybrid) semiconductor device.

17 Claims, 4 Drawing Sheets

ARTICLE COMPRISING A STANDOFF COMPLAINT METALLIZATION AND A METHOD FOR MAKING SAME

FIELD OF THE INVENTION

The present invention relates to semiconductor circuitry and devices.

BACKGROUND OF THE INVENTION

Intensive development efforts in communication technologies, as well as in other "high-technology" disciplines, is fueling a need for high performance semiconductor devices and circuits. For example, in the optical communications arena, the growth in dense wavelength division multiplexing is driving the development of complex opto-electronic circuits such as the electrooptic modulated laser ("EML"), which comprises, among elements, a laser, modulator and photodetector. See, for example, U.S. Pat. Nos. 5,548,607; 5,147,825; 5,543,353; 5,539,763, incorporated by reference herein.

The complexity of design that characterizes the EML, other optoelectronic circuits and devices, and, more generally, semiconductor circuitry, is reflected in the processes used to make them and circuit and device topography. With regard to processing, cost containment efforts for such complex devices have led to the development of "add-on" optical subassemblies and planar lightwave circuits that must be bonded to the "active" side of a complex device. As to topography, a complex device such as the EML may have both active and passive structures that extend beyond a base plane of the device, resulting in a varied topography.

By virtue of their "radical" topography, and the bonding operations to which they are exposed, such devices are subjected to pressure at critical areas, such as the active layers of an EML. Such pressure causes stresses that may directly result in device failure, or may cause damage that leads to reliability problems. As a result, process yields and device performance suffers. As such, a need exists for improved semiconductor circuitry, optoelectronic devices and the like that, while characterized by significant topographical variations, are markedly less susceptible to damage caused by the aforementioned bonding operations.

SUMMARY OF THE INVENTION

In accordance with the present teachings, "compliant standoffs" are disposed on a support surface of a semiconductor or hybrid semiconductor device or circuit ("semiconductor device"). Such compliant standoffs extend further from the support surface than active and/or passive structures associated with the functioning ("device-functional structures") of the semiconductor device. Moreover, such compliant standoffs are laterally offset from device-functional structures. The "top" of such compliant standoffs (i.e., the end remote from the support surface) advantageously serves as a bonding surface at which additional structures, such as optical subassemblies, waveguides, lightwave circuits and the like ("auxiliary devices"), are attached to the semiconductor device.

Since the present compliant standoffs extend further from the support surface than the device-functional structures, the device-functional structures are protected from potentially damaging contact with the auxiliary devices (e.g., during bonding of such auxiliary devices to the semiconductor device). In addition, due to the lateral offset between the compliant standoffs and the device-functional structures, mechanical stresses imparted by contact with auxiliary devices are conducted to the support (e.g., wafer, etc.) rather than the device-functional structures. Moreover, bonding operations for attaching an auxiliary device to the semiconductor device impart thermally-induced stresses that are substantially dissipated by the compliant standoff. Such thermally-induced stresses might otherwise cause damage (i.e., cracks, etc.) in the semiconductor device leading to compromised performance and/or device failure.

The compliant standoffs advantageously comprise a three-layer structure including a compliant layer, a barrier layer, and a wetting layer. The compliant layer, which disperses thermal and mechanical stresses, is disposed on the support surface of a semiconductor device. The wetting layer, which is at the "top" of the compliant standoff, receives a bonding material, such as solder, by which the auxiliary device is bonded to the compliant standoffs. Sandwiched between the compliant layer and the wetting layer is a barrier layer that prevents the bonding material from diffusing into the compliant layer and/or the semiconductor device.

In some embodiments, the compliant standoffs advantageously comprise conductive materials such that, in conjunction with the use of several other layers, they may be placed in ohmic electrical contact with at least one active region of the semiconductor device.

DETAILED DESCRIPTION

In an illustrative embodiment in accordance with the present teachings, compliant standoffs advantageously protect active and/or passive structures of an opto-electronic device and further serve as a bonding surface for attaching auxiliary devices. In the absence of such compliant standoffs, stresses imparted to the semiconductor as a result of attaching such auxiliary devices may cause damage leading to device failure or compromised performance.

In a specific embodiment described herein, compliant standoffs are used in conjunction with an electrooptic modulated laser ("EML"). It should be understood, however, that the present invention is broadly applicable to protect active and/or passive structures of semiconductor and hybrid semiconductor circuits and devices, including, without limitation, silicon electronics, silicon-germanium and silicon-carbide devices, group III–V and II–VI devices, combinations of silicon electronics and III–V or II–VI devices, combinations of III–V or II–VI devices with non-semiconductor structures including auxiliary devices (hereinafter "semiconductor devices").

Figure 1:
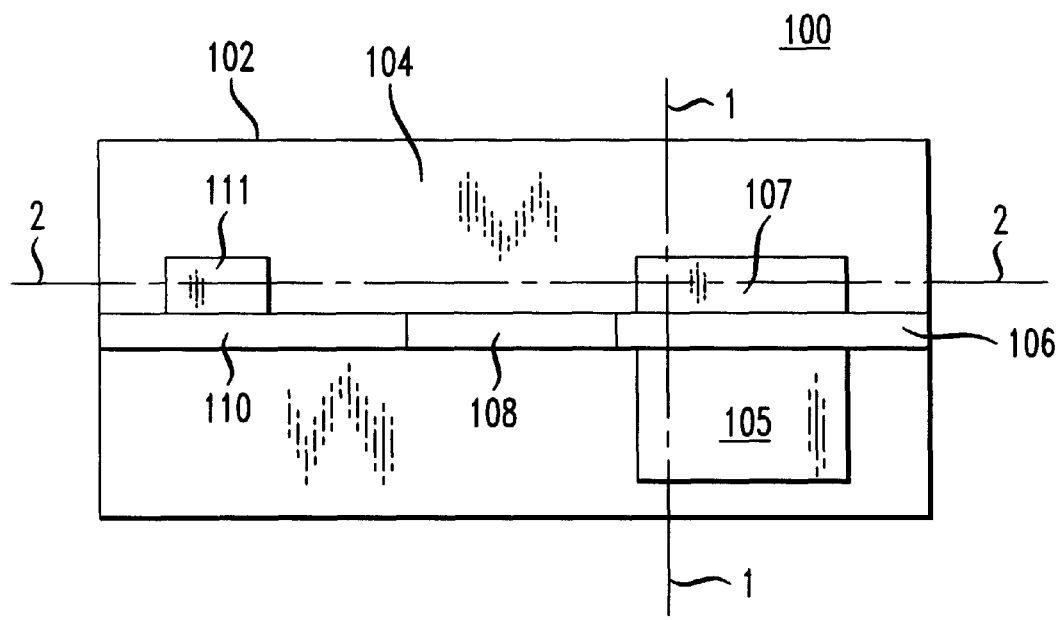
FIG. 1 depicts a simplified schematic of an electrooptic modulated laser (EML).

FIG. 1 depicts a simplified schematic of an EML 100. EML 100 includes support 102 having a surface 104. Structures disposed on surface 104 include active mesa 106 (i.e., the "power" section of the laser), passive waveguide 108 and modulator 110. EML 100 also includes "ohmic" contacts (not shown) disposed on active mesa 106 and modulator 110. A contact is identified as "ohmic" when electrical charge is free to move across the metal-semiconductor interface. Also, a "p-barrier metal contact" (not shown) is disposed over the ohmic contacts and neighboring region of surface 104. Bonding pads 105 and 107 flanking active mesa 106, and bonding pad 111 near modulator 110 are disposed on the p-barrier metal deposited in those regions. The p-barrier metal contact provides electrical contact between the bonding pads and the ohmic contacts, and serves other functions that are described later in this specification.

In operation, active mesa 106 of EML 100 receives electrical charge from a current source (not shown) and emits a beam of light. The beam of light, not shown, is launched into waveguide 108 and then expanded in a beam expander (not shown). The expanded light beam is received by modulator 110, and modulated. A portion of the modulated beam is received by a detector (not shown).

The aforementioned structures (i.e., active mesa 106, etc.) extend to various heights above surface 104. In particular, active mesa 106 and modulator 110 are the structures that extend furthest above surface 104. As such, the active mesa and modulator are vulnerable to damage caused by contact with auxiliary devices during attachment to bonding pads 105, 107 and 111.

Figure 2:
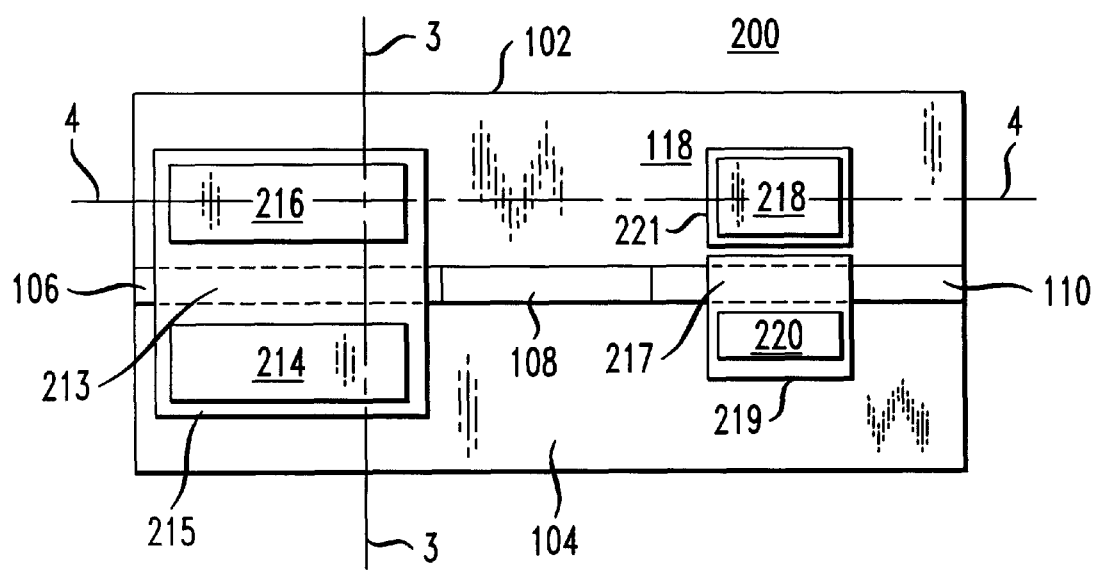
FIG. 2 depicts an EML with compliant standoffs in accordance with an illustrative embodiment of the present invention.

FIG. 2 depicts an improved EML 200 including compliant standoffs in accordance with an illustrative embodiment of the present invention. In EML 200, ohmic contacts 213 and 217 are disposed on active mesa 106 and modulator 110, respectively. P-barrier metal multi-layer contacts 215 and 219 are disposed on respective ohmic contacts 213 and 217 and on nearby regions of support surface 104. The ohmic contacts advantageously comprise gold-beryllium, although other compositions known in the art suitable for said purpose may be used. The p-barrier contacts advantageously comprise a layered arrangement of gold/platinum/titanium, wherein the titanium layer is disposed on support surface 104. Other compositions known in the art as being suitable for such purpose may alternatively be used. Unlike noble metals such as gold and platinum, titanium advantageously adheres well to support 102, which is typically an oxide.

Compliant standoffs 214 and 216, advantageously comprising conductive materials, are disposed on p-barrier contact 215 flanking active mesa 106. Additionally, compliant standoff 218 is disposed on p-barrier contact 221 in field oxide region 118, and compliant standoff 220 is near to modulator 110 on p-barrier contact 219. P-barrier contact 215 advantageously conducts electricity from conductive compliant standoffs 214 and 216 to ohmic contact 213, and, ultimately, to active mesa 106. Likewise, p-barrier contact 219 conducts electricity form conductive compliant standoff 220 to ohmic contact 217 and finally to modulator 110. Moreover, the p-barrier provides a barrier to the transmission of impurities, such as bonding solder, into support 102 and the semiconductor device (e.g., EML 200). As previously mentioned, the p-barrier adheres well to support 102. And while the compliant standoffs do not adhere well to support 102, they do adhere well to the p-barrier. In particular, the upper-most layer of the p-barrier advantageously provides a cleanable surface, such as gold, which facilitates a satisfactory bond to the compliant standoffs.

Figure 3:
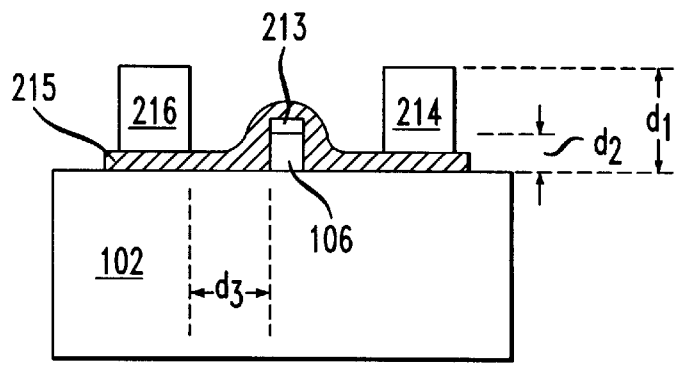
FIG. 3 depicts a side-view of the EML of FIG. 2.

As shown in a side view of EML 200 depicted in FIG. 3, compliant standoffs 214 and 216 advantageously extend a distance $d_1$ from surface 104, while active mesa 106 extends a lesser distance $d_2$ from surface 104. Similarly, compliant standoff 218 (not shown in FIG. 3) advantageously extends a further distance from surface 104 than modulator 110. The compliant standoffs provide a bonding surface for attaching auxiliary devices to the EML. Since the compliant standoffs extend farther from surface 104 than the aforementioned device-functional structures, auxiliary devices attached to the compliant standoffs do not physically contact the device-functional structures.

Moreover, compliant standoffs 214 and 216 are advantageously laterally offset from active mesa 106 by a distance $d_3$. As a result of such offset or space, mechanical and thermal stresses resulting from contact between the compliant standoffs and an auxiliary device are substantially dissipated into support 102, rather than active mesa 106 (or other device-functional structures), as may occur if the compliant standoffs were abutting the active mesa (or other device-functional structures). A lateral offset of about 10 microns has been found to be suitable, although somewhat lesser offsets, as low as about 3 microns, may suitably used. As a practical matter, it is difficult to create an offset or space much smaller than the objects that the space separates. Furthermore, as the offset or space is reduced in size beyond about 3 microns, bonding solder, such as may be used for bonding the compliant standoff to the p-barrier, may tend to wick across the space between the compliant standoff and the protected device. Moreover, as the offset is decreased to levels somewhat below 3 microns, the levels of thermally- and mechanically-imparted stresses due, for example, to bonding an auxiliary device to the compliant standoffs, soon reach levels capable of deleteriously affecting device-functional structures.

Figure 4:
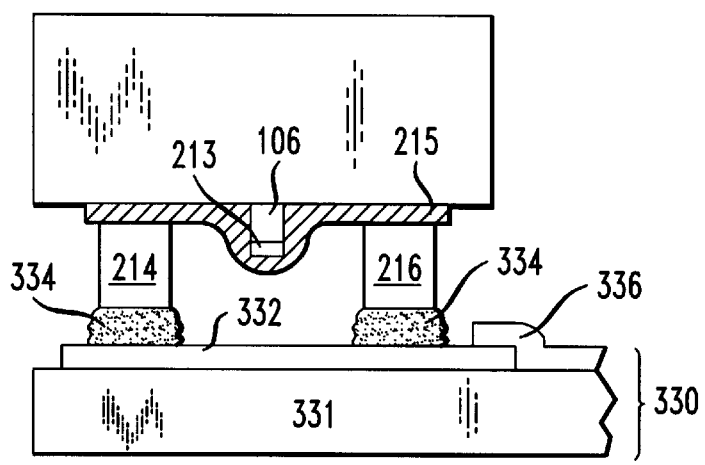
FIG. 4 depicts a side-view of the EML of FIG. 2 attached to an auxiliary device.

FIG. 4 depicts a side-view of an illustrative arrangement that results when the EML of FIG. 2 is attached to an auxiliary device. In the illustrative arrangement, compliant standoffs 214 and 216 are attached, via solder 334, to metallization layer 332 disposed on support 331 of auxiliary device 330. Wire trace 336 is electrically connected to metallization layer 332, and to a current source (not shown). The path of electrical current from the auxiliary device to active mesa 106 is as follows. Current is delivered to metallization layer 332 via wire trace 336. From metallization layer 332, current passes to solder 334 and then into compliant standoff 216 and, to a lesser extent, compliant standoff 214. From the compliant standoffs, current flows into p-barrier contact 215, and then into ohmic contact 213 and, finally, to active mesa 106.

In some embodiments, all compliant standoffs on a given device extend the same distance away from the support surface. In other embodiments, the compliant standoffs on a given device may vary in "height" as a function of the topography of the semiconductor device or the auxiliary device being attached. In the illustrated embodiment, the compliant standoffs were attached to the semiconductor device. In other embodiments, the compliant standoffs are attached to the auxiliary device being attached to the semiconductor device.

Compliant standoffs for use in conjunction with the present invention advantageously possesses certain characteristics. In particular, in some embodiments, such compliant standoffs are advantageously (1) able to withstand mechanical and thermal stresses imparted during bonding operations, (2) adequately wettable by the bonding material (e.g., solder), (3) able to substantially prevent diffusion of the bonding material into the device being protected, and (4) comprised of conductive materials such that the compliant standoffs may be placed in ohmic electrical contact with at least one active region of a semiconductor device.

Figure 5:
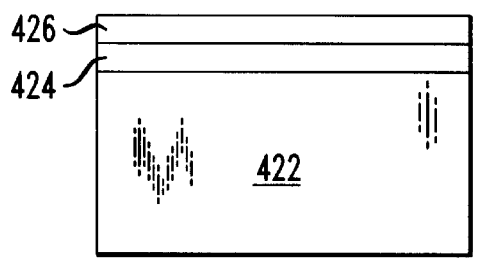
FIG. 5 depicts an illustrative embodiment of compliant standoffs.

In some embodiments, the compliant standoff advantageously comprises three layers, as depicted in FIG. 5. Those layers include compliant layer 422, barrier layer 424 and wetting layer 426. In one embodiment, compliant layer 422 is disposed on surface 104 of EML 200. Compliant layer 422 reduces the extent to which mechanically and thermally-induced stresses are imparted to the EML 200. Compliant layer 422 advantageously comprises a ductile metal, such as, without limitation, gold or aluminum. The compliant layer has a thickness suitable for substantially preventing cracking of surface 104 as may be caused by stress transfer during a cooling period after an auxiliary device is bonded to the compliant standoff. Such cracking is typically due to differences in thermal conductivity and the coefficient of thermal expansion between surface 104 and the auxiliary device. A thickness in the range of about 2 to 8 microns is expected to be sufficient for preventing such cracking.

Wetting layer 426 ensures that a bonding material (e.g., gold-tin solder in a solder bonding procedure) adequately wets the compliant standoff so that a satisfactory bond forms between the compliant standoff and the auxiliary device. Wetting layer 426 advantageously comprises a cleanable, metallic layer, such as, without limitation, gold. Wetting layer 426 advantageously has a thickness in the range of about 0.05 to 1 microns.

Barrier layer 424 is advantageously sandwiched between compliant layer 422 and wetting layer 426. Barrier layer 424 substantially prevents diffusion of bonding material, typically solder, into compliant layer 422 and/or the EML 200. Barrier layer 424 advantageously comprises, without limitation, platinum, palladium or nickel. Barrier layer 424 is sized to prevent the aforementioned diffusion. A thickness in the range of about 0.1 to 1 microns has been found to be satisfactory for such purpose.

In some embodiments, it may be necessary to increase layer thickness beyond the above-stated maximum to provide a clearance of at least about 1 micron between device-functional structures and the auxiliary device. For most embodiments, the above stated ranges should provide sufficient clearance.

Compliant standoffs, such as compliant standoffs 214–220 can be formed by a variety of known methods including evaporation, sputtering, electrodeposition, electroless plating, and the like. Additional information concerning the three-layer composition advantageously utilized for the present compliant standoffs is provided in U.S. Pat. No. 5,559,817, incorporated by reference herein.

FIGS. 6–9 show topological profiles of an EML with and without the present compliant standoffs. Such profiles were obtained using an interferometric microscope, such as model NT2000 from Wyko Division of Veeco Corporation, Phoenix, Ariz. Such topological profiles can be obtained by other means known in the art, such as, for example, stylus profilometry.

Figure 6:
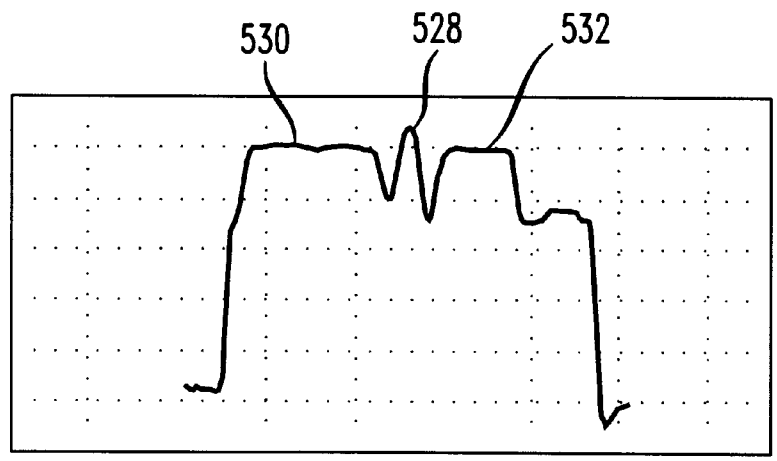
FIG. 6 depicts a plot showing a topological profile along axis 1—1 of the EML of FIG. 1.

FIG. 6 shows a topological profile along axis 1—1 (FIG. 1) of an EML having the structure shown in FIG. 1. Peak 528 corresponds to active mesa 106. Plateaus 530 and 532 correspond to respective bonding pads 105 and 107 flanking active mesa 106. FIG. 6 shows that active mesa 106 extends above the bonding pads and is therefore vulnerable to mechanical stresses caused by contact with auxiliary devices being bonded to the bonded pads.

Figure 7:
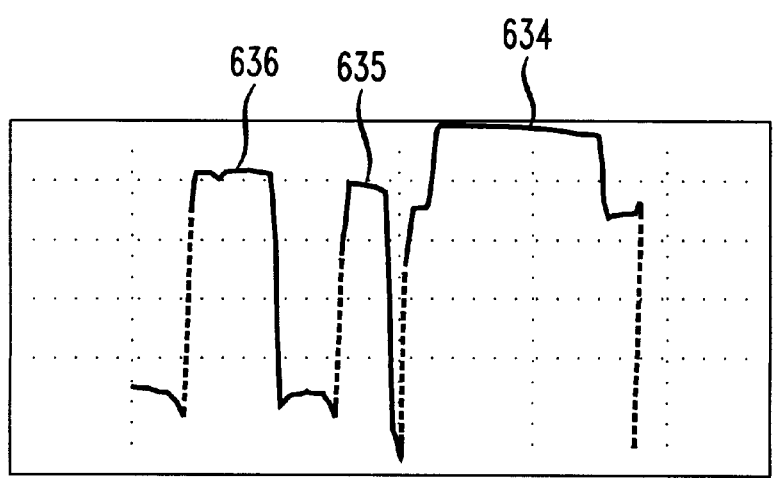
FIG. 7 depicts a plot showing a topological profile along axis 2—2 of the EML of FIG. 1.
Figure 9:
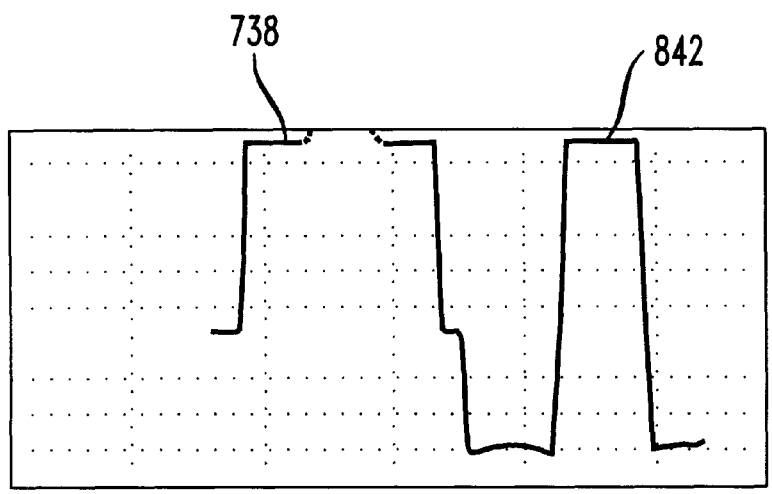
FIG. 9 depicts a plot showing a topological profile along axis 4—4 of the EML of FIG. 2.

FIG. 7 shows a topological profile along axis 2—2 (FIG. 1) of an EML having the structure shown in FIG. 1. Plateau 634 corresponds to bonding pad 111 adjacent to modulator 110 and plateau 636 corresponds to bonding pad 107 adjacent to active mesa 106. Plateau 635 corresponds to a bonding pad not depicted in FIG. 1. Due to data drop-out when profiling high-slope surfaces (i.e., vertical walls), the plots actually obtained from topological profiling show discontinuities in the surface profile. In FIGS. 7 and 9, "dashed" lines are provided in such drop-out regions to illustrate the full surface profile. FIG. 7 shows that bonding pads 111 (plateau 634) and 107 (plateau 636) have different heights. Such different heights may be acceptable if the auxiliary device being bonded to the pads is appropriately configured. Use of pads having differing heights may, however, result in torsional stresses inimical to the semiconductor device.

Figure 8:
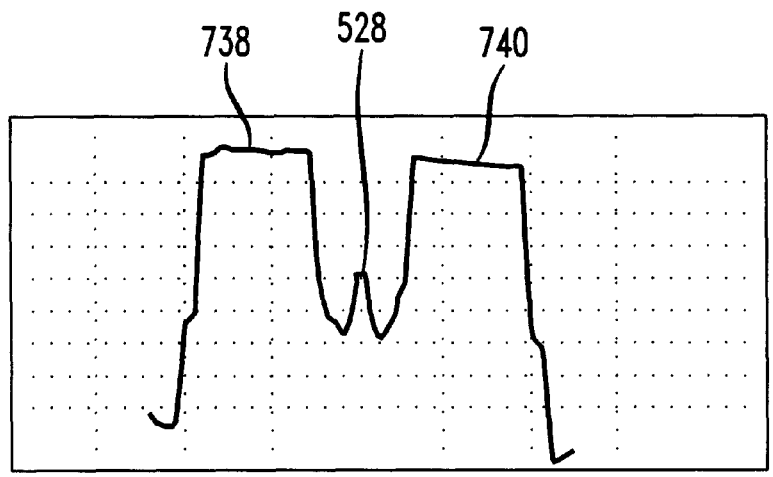
FIG. 8 depicts a plot showing a topological profile along axis 3—3 of the EML of FIG. 2.

FIG. 8 shows a topological profile along axis 3—3 (FIG. 2) of an EML in accordance with the present invention and having the structure shown in FIG. 2. Peak 528 corresponds to active mesa 106 and plateaus 738 and 740 correspond to respective compliant standoffs 214 and 216. Plateaus 738 and 740 are significantly "higher" than peak 528. The flat regions of plateaus 738 and 740 correspond to the bonding surfaces of respective compliant standoffs 214 and 216. It will be appreciated that active mesa 106 will be protected from contact with an auxiliary device being bonded to compliant standoffs 214 and 216.

FIG. 9 shows a topological profile along axis 4—4 (FIG. 2) of an EML in accordance with the present invention and having the structure shown in FIG. 2. Plateau 738 corresponding to compliant standoff 216, and plateau 842 corresponding to compliant standoff 220, are shown in FIG. 9. The plot shows that such standoffs have substantially the same height.

It is to be understood that the embodiments described herein are merely illustrative of the many possible specific arrangements that can be devised in application of the principles of the invention. Other arrangements can be devised in accordance with these principles by those of ordinary skill in the art without departing from the scope and spirit of the invention. It is therefore intended that such other arrangements be included within the scope of the following claims and their equivalents.

We claim:

1. An article comprising:

a support;

a semiconductor device disposed on the support, the semiconductor device comprising several structures extending to various distances from the support; and a compliant standoff disposed on the support, spaced from the several structures, and extending a further distance from the support than the several structures, the compliant standoff operable to substantially prevent contact between the several structures and an auxiliary device that is attached to the compliant standoff, and further operable to disperse thermal and mechanical stresses imparted after said attachment.

2. The article of claim 1, wherein the compliant standoff comprises a compliant layer disposed on a conductive layer disposed on the support, the compliant layer comprising a ductile material.

3. The article of claim 2, wherein the compliant standoff further comprises a wetting layer that receives a bonding material for bonding the auxiliary device thereto.

4. The article of claim 3, wherein the bonding material is solder.

5. The article of claim 3, wherein the compliant standoff further comprises a barrier layer disposed between the compliant layer and the wetting layer, wherein the barrier layer is operable to prevent migration of the bonding material into the compliant layer and the semiconductor device.

6. The article of claim 5, wherein the compliant layer is selected from the group consisting of gold and aluminum, the barrier is selected from the group consisting of platinum, palladium and nickel, and the wetting layer comprises gold.

7. The article of claim 6, wherein the compliant layer has a thickness within a range of about 2 to 8 microns.

8. The article of claim 1, wherein the compliant standoff is conductive.

9. The article of claim 8, wherein at least one of the several structures of the semiconductor device comprises an active region, wherein the compliant standoff is in ohmic electrical contact with the active region.

10. The article of claim 1, wherein the semiconductor device is an opto-electronic device.

11. The article of claim 10, wherein the semiconductor device is a laser.

12. The article of claim 1, wherein the space between the compliant standoff and the several structures is at least about 3 microns.

13. An article comprising:
   a support;
   a semiconductor device disposed on the support and having an emitting region and a waveguiding region; and
   a compliant standoff disposed on the support, wherein the compliant standoff is spaced from the emitting region and the waveguiding region and receives, in bonded engagement, an auxiliary device, wherein the compliant standoff is operable to substantially prevent contact of the auxiliary device with the emitting and waveguiding regions, and further operable to substantially prevent thermal and mechanical stresses that are imparted during and after bonded engagement of the auxiliary device from damaging the semiconductor device.

14. The article of claim 13, wherein the semiconductor device further comprises a modulator region and a detector region.

15. The article of claim 13, wherein the compliant standoff comprises:
   a compliant layer attached to the support, the compliant layer suitable for dispersing the thermal and mechanical stresses;
   a wetting layer that receives a bonding material for bonding the auxiliary device thereto; and
   a barrier layer disposed between the compliant layer and the wetting layer, wherein the barrier layer is operable to prevent penetration of the bonding material into the compliant layer and the semiconductor device.

16. The article of claim 15, wherein the compliant layer a metal selected from the group consisting of gold and aluminum, the barrier layer comprises a metal selected from the group consisting of platinum, palladium and nickel, and the wetting layer comprises gold.

17. The article of claim 13, wherein the compliant standoff is conductive.

* * * * *